United States Patent
Cheng

(10) Patent No.: US 12,527,125 B2
(45) Date of Patent: Jan. 13, 2026

(54) LIGHT-EMITTING DEVICE

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

(*) Notice: Subject to any disclaimer, the term of this patent is extended or adjusted under 35 U.S.C. 154(b) by 405 days.

(21) Appl. No.: 18/318,583

(22) Filed: May 16, 2023

(65) Prior Publication Data

US 2024/0006463 A1 Jan. 4, 2024

(30) Foreign Application Priority Data

Jun. 30, 2022 (CN) .......................... 202210762924.X

(51) Int. Cl.
*H10H 20/819* (2025.01)
*H10H 20/821* (2025.01)
*H10H 29/14* (2025.01)

(52) U.S. Cl.
CPC ........ *H10H 20/821* (2025.01); *H10H 29/142* (2025.01)

(58) Field of Classification Search
CPC ...... H10H 20/80; H10H 20/81; H10H 20/814; H10H 20/8142; H10H 20/817; H10H 20/819; H10H 20/821; H10H 29/142; H10H 20/841; H10H 20/01335; H10H 20/0133; H10H 20/825
See application file for complete search history.

(56) References Cited

U.S. PATENT DOCUMENTS

| | | | | |
|---|---|---|---|---|
| 8,183,134 B2 * | 5/2012 | Wu | .................. | H01L 21/02433 |
| | | | | 257/E21.118 |
| 8,624,292 B2 * | 1/2014 | Pan | ...................... | H10H 20/817 |
| | | | | 257/79 |
| 9,859,381 B2 * | 1/2018 | Li | ..................... | H01L 21/02381 |
| 11,257,927 B2 * | 2/2022 | Hu | ........................ | H10D 64/021 |
| 12,125,944 B2 * | 10/2024 | Tan | ...................... | H10H 20/821 |
| 12,183,852 B2 * | 12/2024 | Brueck | ............. | H01L 21/02433 |
| 2008/0032436 A1 * | 2/2008 | Lee | ...................... | H10H 20/821 |
| | | | | 257/E33.006 |
| 2011/0233581 A1 * | 9/2011 | Sills | ..................... | H10H 20/825 |
| | | | | 257/E33.072 |
| 2018/0166616 A1 * | 6/2018 | White | .................. | H10H 29/142 |

* cited by examiner

*Primary Examiner* — Eduardo A Rodela
(74) *Attorney, Agent, or Firm* — Westbridge IP LLC

(57) ABSTRACT

A light-emitting device includes: a substrate; a first mask layer, a first epitaxial layer and a light-emitting structure. The first mask layer is arranged on the substrate and includes a first opening exposing the substrate, the first opening includes an open end, an area of an orthographic projection of the open end on a plane where the substrate is located is smaller than an area of an orthographic projection of the first opening on the plane where the substrate is located; the first epitaxial layer is epitaxially grown in the first opening on the substrate to fill up the first opening; and the light-emitting structure is arranged on the first epitaxial layer and on the first mask layer. An inward sidewall of the first opening is utilized to terminate dislocations of GaN-based material, thereby reducing a dislocation density of the GaN-based material and improving a light-emitting efficiency.

19 Claims, 7 Drawing Sheets

LIGHT-EMITTING DEVICE

CROSS-REFERENCE TO RELATED APPLICATIONS

This disclosure claims priority to Chinese Patent Application No. 202210762924.X, filed on Jun. 30, 2022, which is hereby incorporated by reference in its entirety.

TECHNICAL FIELD

The present disclosure relates to the technical field of semiconductors, in particular, to a light-emitting device.

BACKGROUND

Gallium nitride (GaN) is a third-generation of a new semiconductor material after the first and second-generation semiconductor materials such as silicon (Si) and gallium arsenide (GaAs). It has many advantages as a wide-bandgap semiconductor material, such as a high saturation drift velocity, a high breakdown voltage, an excellent carrier transport performance, and an ability to form aluminum gallium nitride (AlGaN), indium gallium nitride (InGaN) ternary alloys and aluminum indium gallium nitride (AlInGaN) quaternary alloys, etc., which make GaN-based PN junctions easy to be manufactured. In view of this, GaN-based materials and light-emitting devices have been extensively and in-depth researched in recent years, and technology of Metal-organic Chemical Vapor Deposition (MOCVD) for growing GaN-based materials is becoming more and more mature. In terms of researches on light-emitting devices, researches on optoelectronic devices such as a GaN-based light-emitting diode (LED) and laser diodes (LDs), and microelectronic devices such as GaN-based High Electron Mobility Transistor (HEMT) have achieved remarkable results and considerable development.

SUMMARY

The purpose of the present disclosure is to provide a light-emitting device, to reduce dislocation density of GaN-based materials and improve light-emitting efficiency of the light-emitting device.

To achieve the above purpose, a first aspect of the present disclosure provides a light-emitting device, including:
  a substrate;
  a first mask layer arranged on the substrate, where the first mask layer includes a first opening exposing the substrate, the first opening includes an open end, and an area of an orthographic projection of the open end on a plane where the substrate is located is smaller than an area of an orthographic projection of the first opening on the plane where the substrate is located;
  a first epitaxial layer epitaxially grown in the first opening on the substrate; and
  a light-emitting structure epitaxially grown in the first opening on the first epitaxial layer.

As an optional embodiment, the light-emitting structure includes:
  a second epitaxial layer epitaxially grown in the first opening on the first epitaxial layer;
  an active layer arranged on the second epitaxial layer; and
  a third epitaxial layer arranged on the active layer.

As an optional embodiment, the first mask layer is a multilayer structure.

As an optional embodiment, the first mask layer includes a plurality of first sub-layers and a plurality of second sub-layers alternately arranged, a refractive index of the plurality of first sub-layers being different with a refractive index of the plurality of second sub-layers to form a Bragg reflector, and the Bragg reflector makes a light emitted by the light-emitting structure exit in a direction, perpendicular to the plane where the substrate is located, away from the substrate.

As an optional embodiment the first mask layer includes a metal reflective layer, and an orthographic projection of the light-emitting structure on the plane where the substrate is located overlaps with at least a part of an orthographic projection of the metal reflective layer on the plane where the substrate is located, and the metal reflective layer makes the light emitted by the light-emitting structure exit in a direction, perpendicular to the plane where the substrate is located, away from the substrate.

As an optional embodiment, the first opening includes a plurality of groups, each group includes a plurality of first openings, and an area of an open end of each first opening in a group is different from each other in the group and/or a distance between open ends of each pair of adjacent first openings in the group is different from each other in the group, so that light-emitting wavelengths of light-emitting structures corresponding to different open ends are different.

As an optional embodiment, the light-emitting structure includes an active layer arranged on the second epitaxial layer. A composition of the active layer is InGaN, and the area of an open end of each first opening in the group is different from each other in the group and/or a distance between open ends of each pair of adjacent first openings in the group is different from each other in the group, so that light-emitting wavelengths of light-emitting structures corresponding to different open ends are different so that a content of In in InGaN, of each first opening in the group is different from each other in the group.

As an optional embodiment, the first opening further includes a bottom wall end arranged on a surface of the substrate, and the orthographic projection of the open end on the plane where the substrate is located and the bottom wall end are at least partially staggered.

As an optional embodiment, the orthographic projection of the open end on the plane where the substrate is located and the bottom wall end are completely staggered.

As an optional embodiment, the first opening is an oblique columnar opening.

As an optional embodiment, an inclination angle of the oblique columnar opening is less than or equal to 60°.

As an optional embodiment, in a direction from the substrate to the open end, a cross-sectional area of the first opening first increases and then decreases; or in the direction from the substrate to the open end, the cross-sectional area of the first opening gradually decreases; or in the direction from the substrate to the open end, the cross-sectional area of the first opening remains equal.

As an optional embodiment, in a direction from the substrate to the open end, a line connecting centers of cross-sections of the first opening is any one of a straight line, a broken line and a curved line.

As an optional embodiment, the substrate is a single-layer structure, and materials of the substrate and the epitaxial layer are the same or different.

As an optional embodiment, the substrate is a multi-layer structure, the substrate includes a semiconductor substrate and a transition layer arranged on the semiconductor substrate, materials of the transition layer and the epitaxial layer are the same or different, and the transition layer is a common electrode of a plurality of light-emitting structures, and the transition layer is a common electrode of a plurality of light-emitting structures.

As an optional embodiment, a ratio of a thickness of the first epitaxial layer to a thickness of the light-emitting structure is greater than or equal to 2.

As an optional embodiment, a depth-width ratio of the first opening ranges from 3 to 10.

As an optional embodiment, the light-emitting device further includes:
a first electrode penetrating through the substrate, where the first electrode is electrically connected to the second epitaxial layer; and a second electrode penetrating through the first epitaxial layer, the active layer, the second epitaxial layer, the first mask layer, and the substrate, where the second electrode is electrically connected to the third epitaxial layer.

As an optional embodiment, the light-emitting device further includes: an insulating material layer provided between the second electrode and a sidewall of a through hole penetrating through the first epitaxial layer, the active layer, the second epitaxial layer, the first mask layer and the substrate; and an insulating material layer provided between the first electrode and the second electrode.

As an optional embodiment, the light-emitting device further includes: a first electrode penetrating through the active layer and the second epitaxial layer, where the first electrode is electrically connected to the second epitaxial layer; and a second electrode electrically connected to the third epitaxial layer.

As an optional embodiment, the light-emitting device further includes: a first electrode; a groove penetrating through the active layer and the second epitaxial layer, where the groove exposes the second epitaxial layer, and the first electrode is electrically connected to the second epitaxial layer; and a second electrode electrically connected to the third epitaxial layer.

DETAILED DESCRIPTION OF THE EMBODIMENTS

In order to make the above purpose, features and advantages of the present disclosure more obvious and understandable, specific embodiments of the present disclosure will be described in detail below with reference to accompanying drawings.

With a deeper application of GaN-based materials on display devices, a demand for high dislocation density of GaN-based materials in terminal products is further increased. According to a traditional mode, the GaN-based material epitaxially grown on the mainstream GaN-based epitaxial substrate aluminum oxide ($Al_2O_3$) substrate using mainstream MOCVD epitaxy equipment has a dislocation surface density of $1\sim3E8/cm^3$. In order to manufacture GaN-based light-emitting devices with higher light-emitting efficiency, the dislocation density of GaN-based materials must be further reduced.

In view of this, it is necessary to provide a new light-emitting device to meet the above requirements.

Figure 1:
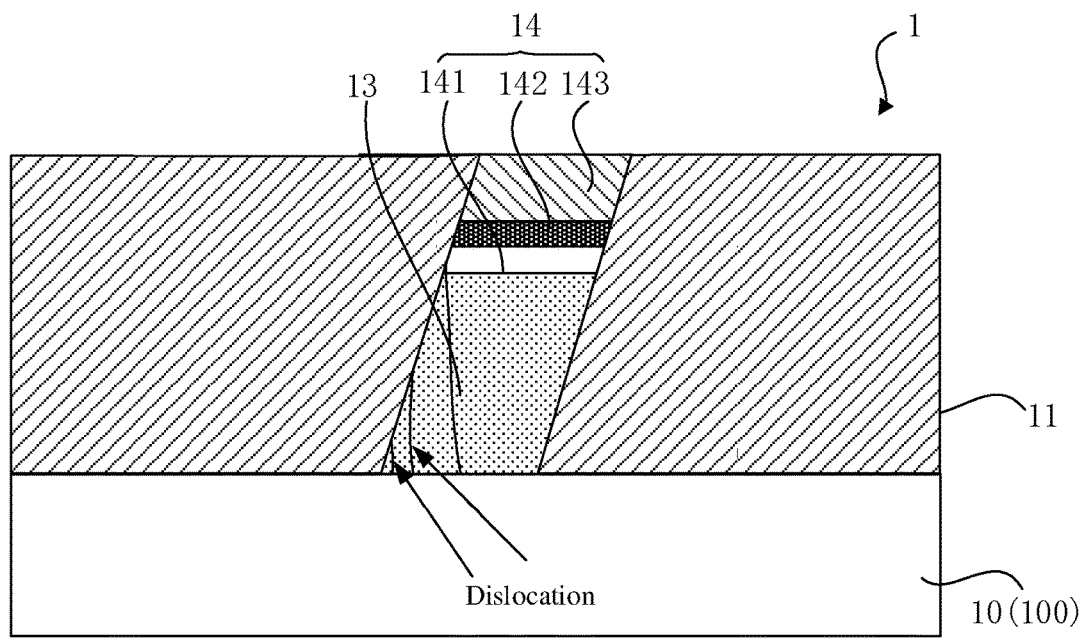
FIG. 1 is a cross-sectional schematic structural diagram of a light-emitting device according to an embodiment of the present disclosure.
Figure 2:
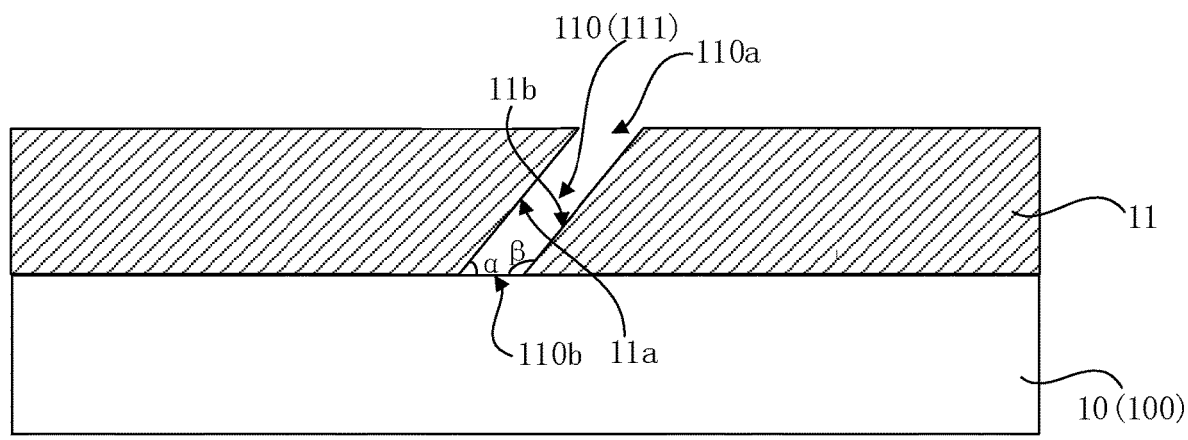
FIG. 2 is a cross-sectional schematic structural diagram of a substrate and a first mask layer of the light-emitting device according to the embodiment shown in FIG. 1.

FIG. 1 is a cross-sectional schematic structural diagram of a light-emitting device according to an embodiment of the present disclosure. FIG. 2 is a cross-sectional schematic structural diagram of a substrate and a first mask layer of the light-emitting device according to the embodiment shown in FIG. 1. Referring to FIG. 1 and FIG. 2, a light-emitting device 1 includes:
a substrate 10;
a first mask layer 11 arranged on the substrate 10, where the first mask layer 11 includes a first opening 110 exposing the substrate 10, the first opening 110 includes an open end 110a, an area of an orthographic projection of the open end 110a on a plane where the substrate 10 is located is smaller than an area of an orthographic projection of the first opening 110 on the plane where the substrate 10 is located;
a first epitaxial layer 13 epitaxially grown in the first opening 110 on the substrate 10; and
a light-emitting structure 14 epitaxially grown in the first opening 110 on the first epitaxial layer 13.

The light-emitting structure 14 includes a second epitaxial layer 141 epitaxially grown in the first opening 110 on the first epitaxial layer 13; an active layer 142 arranged on the second epitaxial layer 141; and a third epitaxial layer 143 arranged on the active layer 142.

In this embodiment, the substrate 10 is a multi-layer structure. For example, the substrate 10 includes a semiconductor substrate 100 and a nucleation layer (not shown) on the semiconductor substrate 100. A material of the semiconductor substrate 100 may include at least one of sapphire, silicon carbide and single crystal silicon, and a material of the nucleation layer may be AlN.

In this embodiment, the semiconductor substrate 100 refers to a substrate for an epitaxial growth of a semiconductor material, and the material of the semiconductor substrate 100 is not limited to be a semiconductor.

In other embodiments, the substrate 10 may be a single-layer structure. For example, the substrate 10 is the semiconductor substrate 100. The material of the semiconductor substrate 100 may be silicon carbide.

In this embodiment, the first mask layer 11 is a single-layer structure. A material of the first mask layer 11 may be one of silicon dioxide and silicon nitride.

In this embodiment, the first mask layer 11 includes a first opening 110, and the first opening 110 is an oblique columnar opening 111. A vertical section of the oblique columnar opening 111 is an inclined parallelogram, and the vertical section here refers to a section on a plane perpendicular to the substrate 10. A cross section of the oblique columnar opening 111 is rectangular, and the cross section here refers to a section on a plane parallel to the substrate 10.

The first mask layer 11 includes a first sidewall 11a and a second sidewall 11b that are opposite to each other. A first angle α is formed between the first sidewall 11a and the substrate 10 exposed by the oblique columnar opening 111, and the first angle α is an acute angle. A second angle β is formed between the second side wall 11b and the substrate 10 exposed by the oblique columnar opening 111, and the second angle β is an obtuse angle. The first angle α is equal to a supplementary angle of the second angle β. Optionally, an inclination angle of the oblique columnar opening 111 is less than 60°, that is, the first angle α≤60°. Optionally, in the oblique columnar opening 111, the first angle α is smaller than the supplementary angle of the second angle β. By decreasing the first angle α, an area of the first sidewall 11a which may terminate an extension of the dislocation may be increased, so that an effect of dislocation termination in the GaN material epitaxially grown in the first opening 110 may be better. Furthermore, dislocation density of the GaN material epitaxially grown in the first opening 110 is lower.

The oblique columnar opening 111 further includes a bottom wall end 110b arranged on a surface of the substrate 10, and an orthographic projection of an open end 110a on the plane where the substrate 10 is located and the bottom wall end 110b are completely staggered. Benefits of the above arrangement include: when a dislocation of material epitaxially grown in the oblique columnar opening 111 is extended along or has an angle with a thickness direction of the first mask layer 11, the smaller the angle between the sidewall of the oblique columnar opening 111 and the direction of the plane where the substrate 10 is located is, the larger the area of the sidewall that terminates dislocation extension is, and the better the termination effect is. For example, when a material of the first epitaxial layer 13 which is epitaxially grown is GaN, a dislocation of the GaN material are mainly a linear dislocation in a crystal direction, that is, a linear dislocation extending along the thickness direction of the first mask layer 11. The smaller the first angle α formed between the sidewall 11a and the substrate 10 exposed by the oblique columnar opening 111 is, the larger the area of the first sidewall 11a that terminates the dislocation extension is, and thus the better the termination effect is. Therefore, the dislocation density in the light-emitting structure 14 epitaxially grown on the first epitaxial layer 13 and the first mask layer 11 is lower.

In other embodiments, the orthographic projection of the open end 110a on the plane where the substrate 10 is located and the bottom wall end 110b may also at least partially staggered.

In other embodiments, a cross section of the first opening 110 may be in other shapes such as a triangle, a hexagon or a circle.

A material of the second epitaxial layer 141 is the same as that of the first epitaxial layer 13, which may be GaN. A material of the active layer 142 may be at least one of AlGaN, InGaN and AlInGaN. A material of the third epitaxial layer 143 may be GaN. A conductivity type of the second epitaxial layer 141 is opposite to that of the third epitaxial layer 143, for example, one is a p-type doped epitaxial layer and the other is an n-type doped epitaxial layer.

In other embodiments, the light-emitting structure 14 may also be other structures, which are not limited in this embodiment.

A material of the first mask layer 11 may be one of silicon dioxide and silicon nitride, which are formed by physical vapor deposition or chemical vapor deposition. In this embodiment, the first mask layer 11 is a single-layer structure. The single layer structure may be formed in a single process.

In this embodiment, when the first opening 110, which is an oblique columnar opening 111, is formed, the oblique columnar opening 111 may be obtained by controlling a type and a flow rate of etching gas during dry etching or controlling a direction of plasma.

A preparation process of the first epitaxial layer 13, the second epitaxial layer 141, the active layer 142 and the third epitaxial layer 143 may include: Atomic layer deposition (ALD), or Chemical Vapor Deposition (CVD), or Molecular Beam Epitaxy (MBE), or Plasma Enhanced Chemical Vapor Deposition (PECVD), or Low Pressure Chemical Vapor Deposition (LPCVD), or Metal-Organic Chemical Vapor Deposition (MOCVD), or a combination thereof. Doped ions in the second epitaxial layer 141 and the third epitaxial layer 143 may be in-situ doped.

When the substrate 10 is a multi-layer structure, for example, a multi-layer structure including a semiconductor substrate 100 and a nucleation layer arranged on the semiconductor substrate 100, the epitaxial growth of the first epitaxial layer 13 and the second epitaxial layer 141 on the nucleation layer is heteroepitaxial. When the substrate 10 is a single-layer structure, for example, a silicon carbide semiconductor substrate 100 as the substrate 10, the epitaxial growth of the first epitaxial layer 13 and the second epitaxial layer 141 on the semiconductor substrate 100 is homoepitaxial.

Materials of the first epitaxial layer 13 and the second epitaxial layer 141 are the same, which may be a GaN-based material, such as GaN. The dislocation of the GaN-based material is along a thickness direction of the first mask layer 11 or have an included angle with the thickness direction of the first mask layer 11. Since there is an angle α between the first sidewall 11a of the oblique columnar opening 111 and a plane where the substrate 10 is located, the dislocation of the first epitaxial layer 13 may be terminated when extending to the first sidewall 11a, thereby reducing the dislocation density in the light-emitting structure 14.

In other embodiments, a ratio of a thickness of the first epitaxial layer 13 to a thickness of the light-emitting structure 14 is greater than or equal to 2.

In other embodiments, a depth-width ratio of the first opening ranges from 3 to 10.

As the light-emitting structure 14 in the light-emitting device 1 in this embodiment is grown in the first opening 110, by increasing the depth-width ratio of the first opening 110 or the thickness of the first epitaxial layer 13, the area of the first sidewall that terminates the extension of the dislocation may be increased. Therefore, a dislocation termination effect in the GaN material epitaxially grown in the first opening 110 may be better. Furthermore, the lower the dislocation density of the GaN material epitaxially grown in the first opening 110 is, the better the quality of the light-emitting device is.

Figure 3:
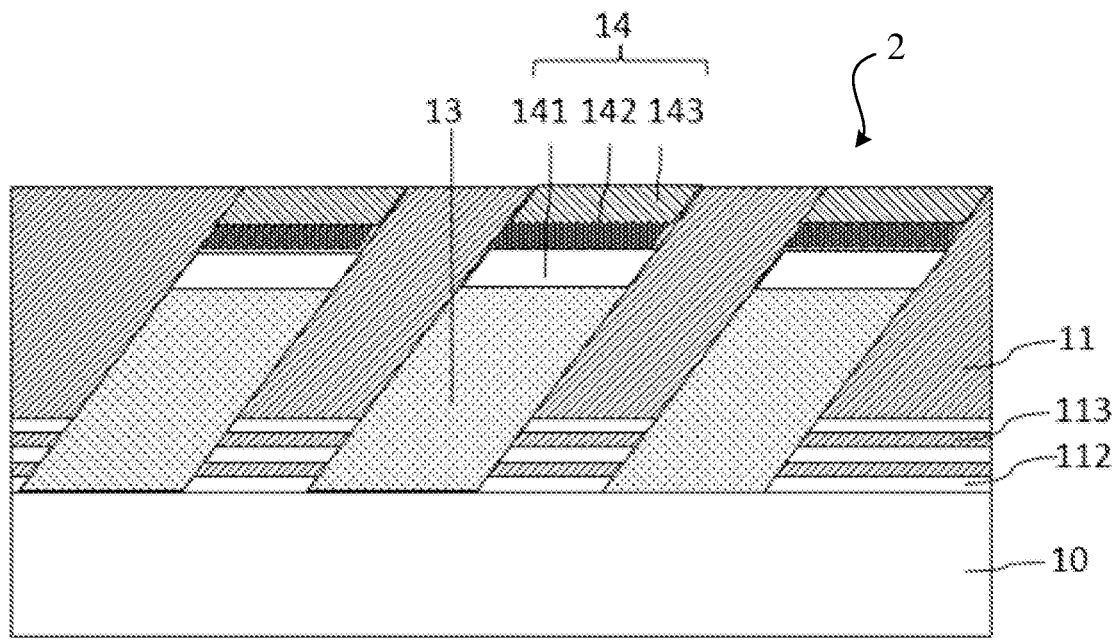
FIG. 3 is a cross-sectional schematic structural diagram of a light-emitting device according to an embodiment of the present disclosure.

FIG. 3 is a cross-sectional schematic structural diagram of a light-emitting device according to an embodiment of the present disclosure.

Referring to FIG. 3, a difference between the light-emitting device 2 of this embodiment and the light-emitting device 1 of the embodiment shown in FIG. 1 is that the first mask layer 11 is a multi-layer structure, and the multi-layer structure includes a plurality of first sub-layers 112 and a plurality of second sub-layers 113 alternately arranged. A refractive index of the plurality of first sub-layers 112 and a refractive index the plurality of second sub-layers 113 are different so as to form a Bragg reflector, and the Bragg reflector makes a light emitted by the light emitting structure 14 exit in a direction, perpendicular to the plane where the substrate 10 is located, away from the substrate 10.

A material of the plurality of first sub-layers 112 may be one of silicon dioxide and silicon nitride, and a material of the plurality of second sub-layers 113 is the other one.

A total reflection structure may be form by alternately arranging the plurality of first sub-layers 112 and the plurality of second sub-layers 113, so that the light emitted by the light-emitting structure 14 is totally reflected in a direction toward the substrate 10. Furthermore, light-emitting brightness of the light-emitting device 2 is improved.

Except for the above differences, other structures of the light-emitting device 2 in this embodiment are the same as corresponding structures of the light-emitting device 1 in the embodiment shown in FIG. 1.

Figure 4:
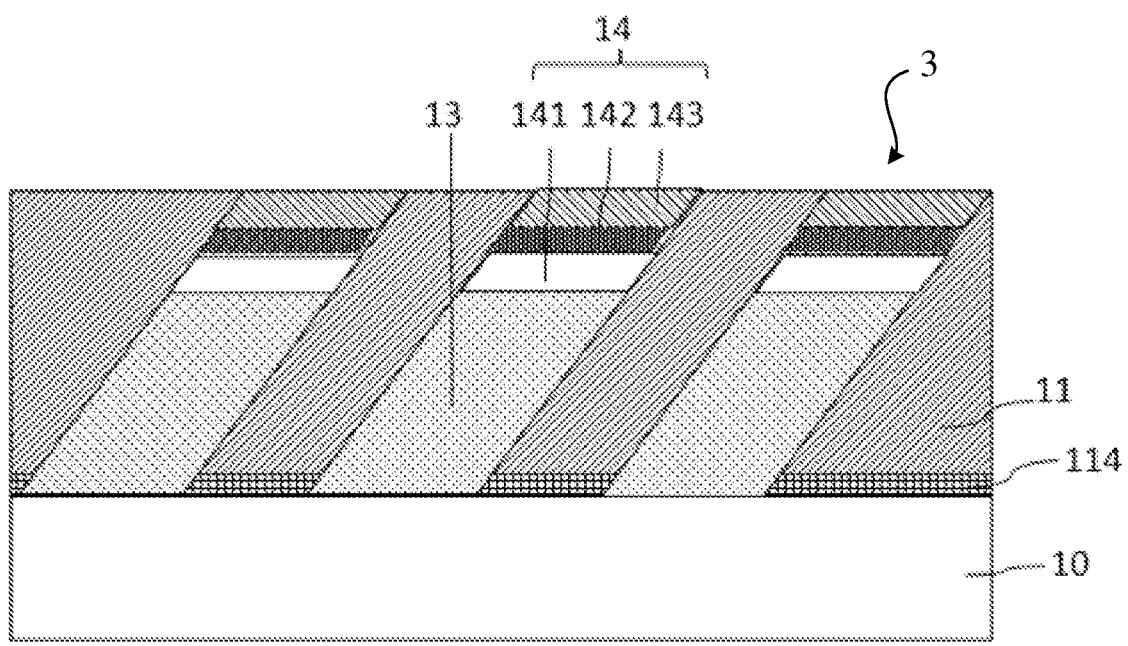
FIG. 4 is a cross-sectional schematic structural diagram of a light-emitting device according to an embodiment of the present disclosure.

FIG. 4 is a cross-sectional schematic structural diagram of a light-emitting device according to an embodiment of the present disclosure.

Referring to FIG. 4, a difference between a light-emitting device 3 of this embodiment and the light-emitting device 1 of the embodiment shown in FIG. 1 is that the first mask layer 11 includes a metal reflective layer 114, and an orthographic projection of the light-emitting structure 14 on the plane where the substrate 10 is located overlaps with at least a part of an orthographic projection of the metal reflective layer 114 on the plane where the substrate 10 is located. The metal reflective layer 114 makes the light emitted by the light-emitting structure 14 emit in a direction, perpendicular to the plane where the substrate 10 is located, away from the substrate 10.

A material of the metal reflective layer 114 may be silver.

The metal reflective layer 114 in this embodiment may improve the light-emitting brightness of the light-emitting device 3.

Except for the above difference, other structures of the light-emitting device 3 in this embodiment are the same as corresponding structures of the light-emitting device 1 in the embodiment shown in FIG. 1.

Figure 5:
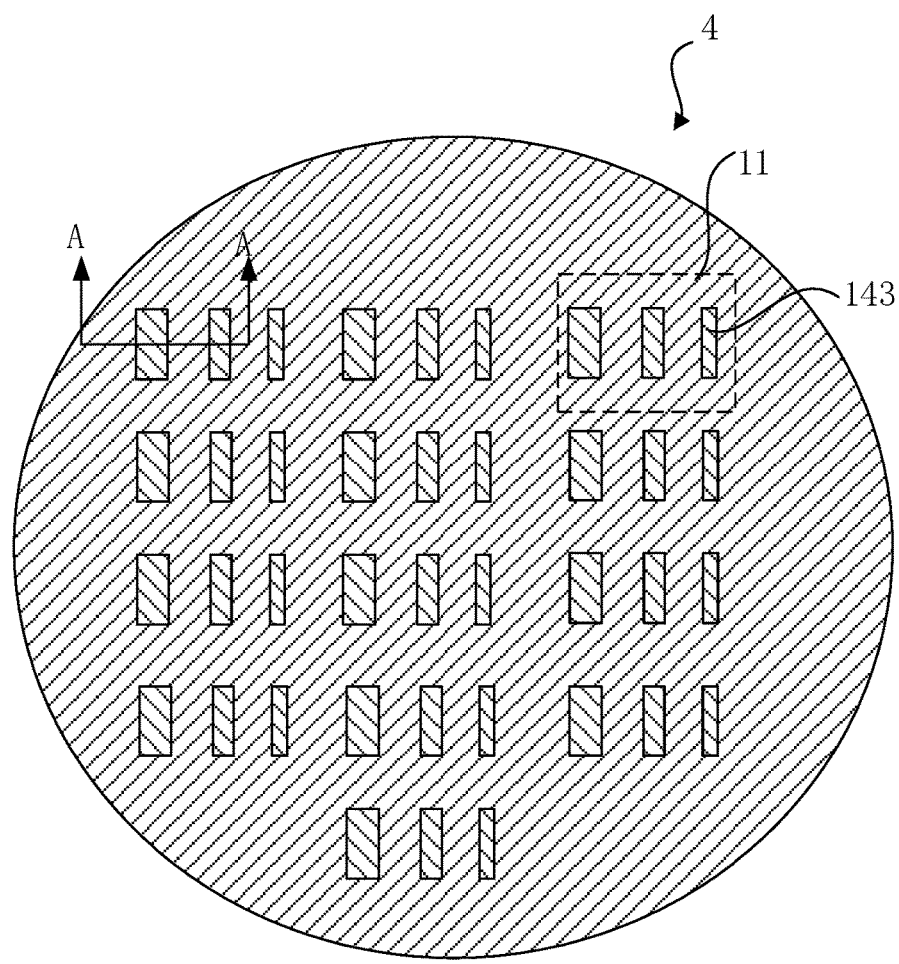
FIG. 5 is a top-view schematic structural diagram of a light-emitting device according to an embodiment of the present disclosure.
Figure 6:
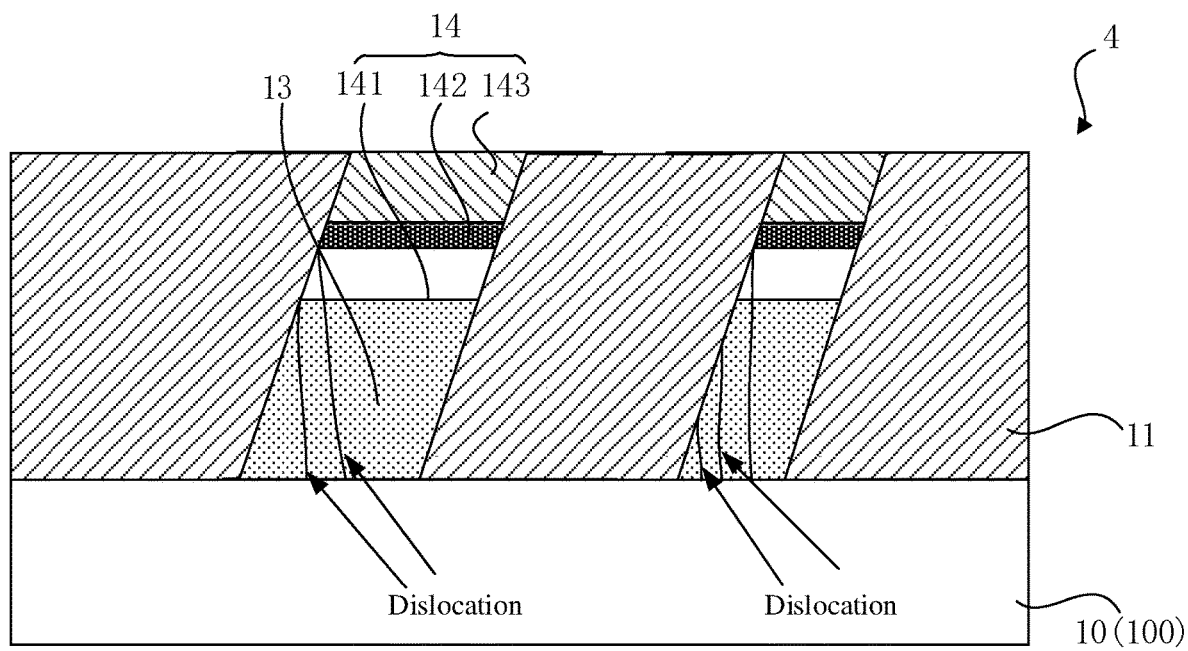
FIG. 6 is a cross-sectional view along line AA of the light-emitting device according to the embodiment shown in FIG. 5.
Figure 7:
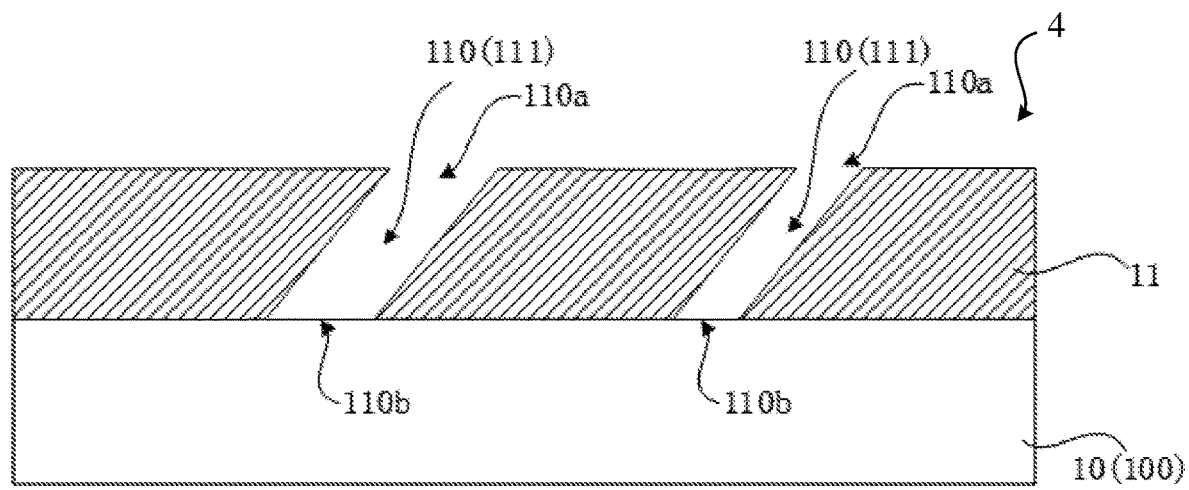
FIG. 7 is a cross-sectional schematic structural diagram of a substrate and a first mask layer of a light-emitting device according to the embodiment shown in FIG. 6.

FIG. 5 is a top-view schematic structural diagram of a light-emitting device according to an embodiment of the present disclosure. FIG. 6 is a cross-sectional view along line AA of the light-emitting device according to the embodiment shown in FIG. 5. FIG. 7 is a cross-sectional schematic structural diagram of a substrate and a first mask layer of a light-emitting device according to the embodiment shown in FIG. 6.

Referring to FIG. 5 to FIG. 7, a difference between the light emitting device 4 of this embodiment and the light emitting devices 1 to 3 of the embodiments shown in FIG. 1 to FIG. 4 is that the first opening 110 includes a plurality of groups, each group includes a plurality of first openings 110, and an area of an open end 110a of each first opening 110 in a group is different from each other in the group, so that light-emitting wavelengths of the light-emitting structure 14 corresponding to different open ends 110a are different.

For example, the smaller an area of the open end 110a of the first opening 110 is, the smaller the area of an upper surface of the first epitaxial layer 13 is and the smaller a proportion of the upper surface area of the first epitaxial layer 13 within an unit area of an upper surface of the first mask layer 11 is, that is the smaller a proportion of pores of the upper surface of the first epitaxial layer 13 is. The smaller the proportion of pores of the upper surface of the first epitaxial layer 13 is, the faster a growth rate of a base material GaN of the active layer 142 above the upper surface of the first epitaxial layer 13 is, so that selectivity of doping of indium (In) element is better, and a doping rate of In element is higher than a doping rate of Ga element. Therefore, the smaller the proportion of pores of the upper surface of the first epitaxial layer 13 is, the higher a composition content of the In element in InGaN in the active layer 142 is, the longer a light-emitting wavelength of the light-emitting structure 14 is. The larger the area of the open end 110a of the first opening 110 is, the lower the composition content of the In element in InGaN in the active layer 142 is, and the shorter the light-emitting wavelength of the light-emitting structure 14 is.

In other embodiments, a distance between the open ends 110a of each pair of adjacent first openings 110 may also be controlled to be different, so that the light-emitting wavelength of the light-emitting structure 14 corresponding to each open end 110a is different from each other. The principle thereof is explained as follows.

A larger distance between the open ends 110a of adjacent first openings 110 means a smaller proportion of the upper surface area of the first epitaxial layer 13 in the unit area of the upper surface of the first mask layer 11, that is, the smaller the proportion of holes on the upper surface of the first epitaxial layer 13 is, the higher the composition content of In in the InGaN active layer 142 above the upper surface of the first epitaxial layer 13, and the longer the light-emitting wavelength of the light-emitting structure 14 is. The shorter the distance between the open ends 110 a of adjacent first openings 110 is, the lower the composition content of In in the InGaN active layer 142 is, and the shorter the light-emitting wavelength of the light-emitting structure 14 is.

In addition, in some embodiments, arrangement of unequal area of the open ends 110a of each first opening 110 in a group and unequal distance between the open ends 110a of adjacent first openings 110 may be combined.

Figure 8:
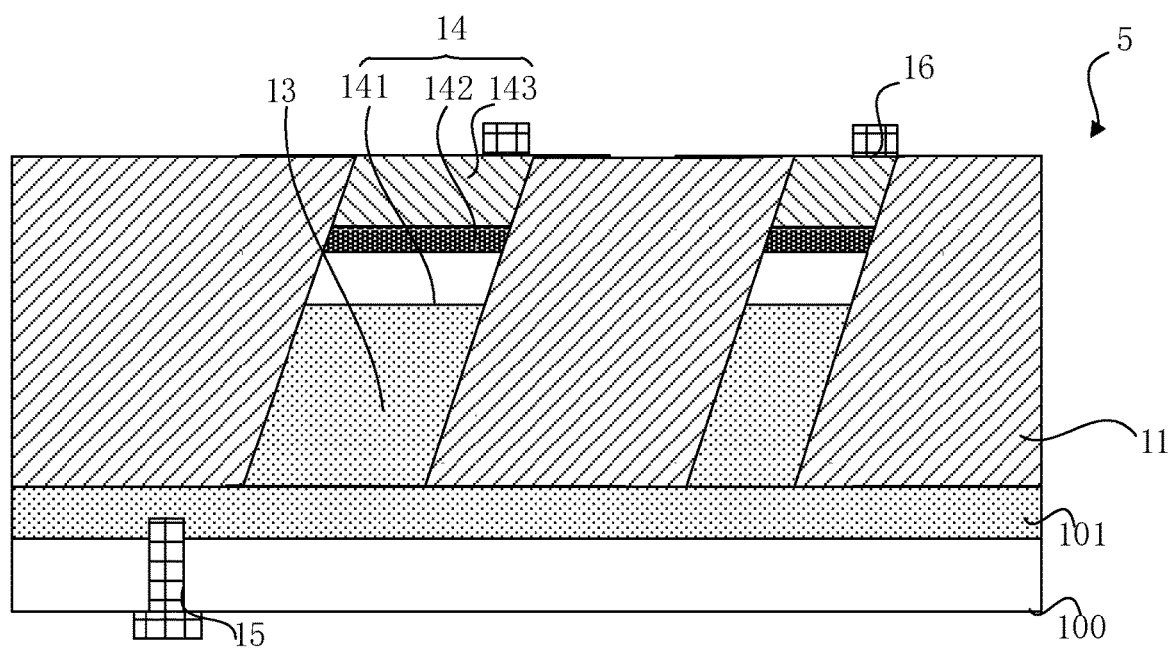
FIG. 8 is a cross-sectional schematic structural diagram of a light-emitting device according to an embodiment of the present disclosure.

FIG. 8 is a cross-sectional schematic structural diagram of a light-emitting device according to an embodiment of the present disclosure.

Referring to FIG. 8, a difference between the light-emitting device 5 of this embodiment and the light-emitting devices 1 to 4 of the embodiments shown in FIGS. 1 to 7 is that the substrate 10 includes a semiconductor substrate 100 and a transition layer 101 arranged on the semiconductor substrate 100. Materials of the transition layer 101 and the epitaxial layer 12 are the same or different, where the transition layer 101 is a common electrode of a plurality of light-emitting structures 14.

Materials of the transition layer 101 and the first epitaxial layer 13 may also be the same or different.

For example, the material of the transition layer 101 is GaN. Compared with the embodiment in which the transition layer 101 is omitted and the GaN material is epitaxially grown directly on a sapphire or a single crystal silicon semiconductor substrate 100, this embodiment may further reduce the dislocation density of the light-emitting structure 14.

Figure 9:
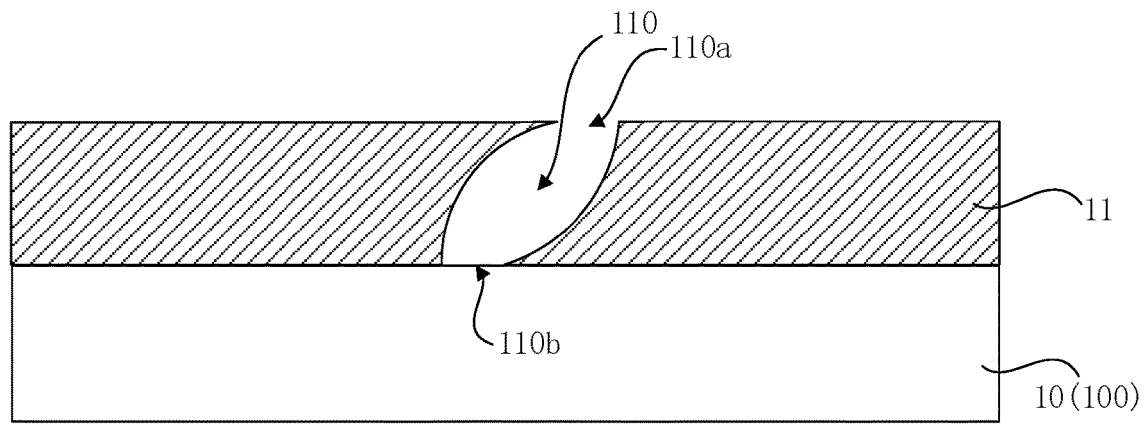
FIG. 9 is a cross-sectional schematic structural diagram of a substrate and a first mask layer of a light-emitting device according to an embodiment of the present disclosure.

FIG. 9 is a cross-sectional schematic structural diagram of a substrate and a first mask layer of a light-emitting device according to an embodiment of the present disclosure.

Referring to FIG. 9, a difference between the light-emitting device of this embodiment and the light-emitting device of the embodiment shown in FIG. 1 is that in a direction from the substrate 10 to the open end 110a, the cross-sectional area of the first opening 110 first increases and then decreases.

The cross-sectional area of the first opening 110 refers to an area of a cross-section on the plane parallel to the substrate 10.

The area of the orthographic projection of the open end 110a of the first opening 110 on the plane where the substrate 10 is located being smaller than the area of the orthographic projection of the first opening 110 on the plane where the substrate 10 is located means that in the direction from the bottom wall end 110b toward the open end 110a, sidewalls the first opening 110 are inward. With the inward sidewalls of the first opening 110, the dislocations of the GaN-based material epitaxially grown may be terminated at the sidewalls of the first opening 110, so that dislocations may not extend outside the first opening 110. Thus, the substrate 10 having the above-mentioned first mask layer 11 may reduce the dislocation density of the second epitaxial layer 141. The active layer 142 and the third epitaxial layer 143 are formed by epitaxial growth on the second epitaxial layer 141, so dislocation density in the active layer 142 and the third epitaxial layer 143 may also be reduced.

In addition to the above differences, other structures and process steps of the light-emitting device of this embodiment are the same as corresponding structures and process steps of the light-emitting device of the embodiment shown in FIG. 1.

Optionally, in the direction from the substrate 10 to the open end 110a, the cross-sectional area of the first opening 110 gradually decreases; or in the direction from the substrate 10 to the open end 110a, the cross-sectional area of the first opening 110 remains equal.

Figure 10:
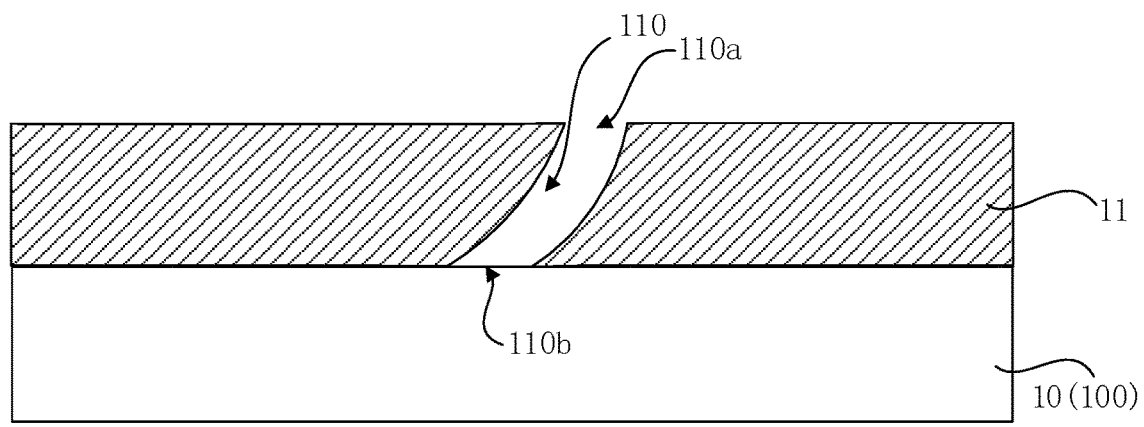
FIG. 10 is a cross-sectional schematic structural diagram of a substrate and a first mask layer of a light-emitting device according to an embodiment of the present disclosure.

FIG. 10 is a cross-sectional schematic structural diagram of a substrate and a first mask layer of a light-emitting device according to an embodiment of the present disclosure.

Referring to FIG. 10, a difference between the light-emitting device of this embodiment and the light-emitting device of the embodiment shown in FIG. 1 is that the cross-sectional area of the first opening 110 remains equal and in a direction from the substrate 10 to the open end 110a, a line connecting centers of cross-sections of the first opening 110 is a curved line.

In other embodiments, in the direction from the substrate 10 to the open end 110a, the cross-sectional area of the first opening 110 may first decrease and then increase or gradually decrease; and/or the cross-section of the first opening 110 is a pattern with a symmetry center, and in the direction from the substrate 10 to the open end 110a, the line connecting the centers of the cross-sections of the first opening 110 is a straight line.

In addition to the above differences, other structures and process steps of the light-emitting device of this embodiment are the same as corresponding structures and process steps of the light-emitting device of the embodiment shown in FIG. 1.

Figure 11:
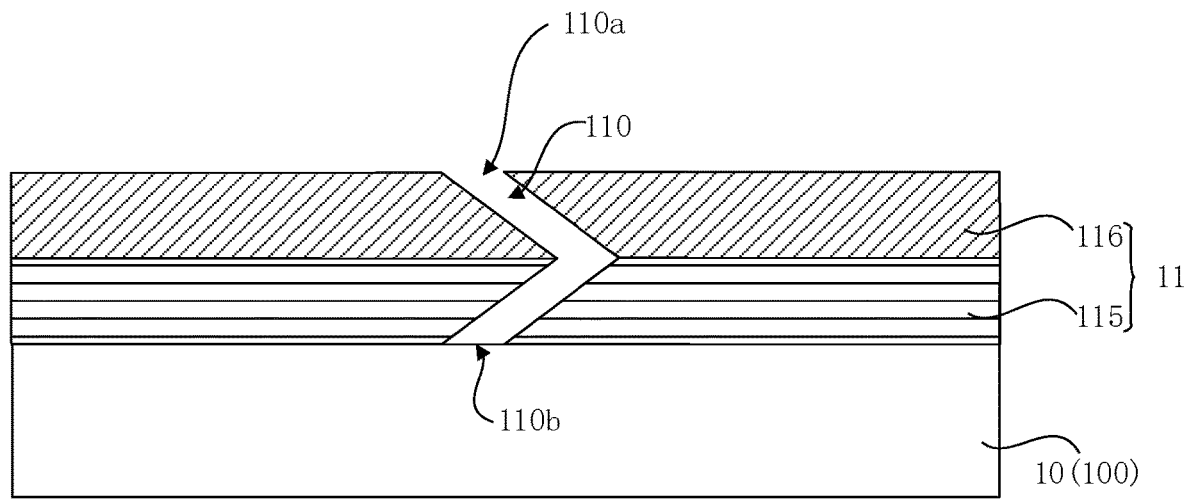
FIG. 11 is a cross-sectional schematic structural diagram of a substrate and a first mask layer of a light-emitting device according to an embodiment of the present disclosure.

FIG. 11 is a cross-sectional schematic structural diagram of a substrate and a first mask layer of a light-emitting device according to an embodiment of the present disclosure.

Referring to FIG. 11, a difference between the light-emitting device of this embodiment and the light-emitting device of the embodiment shown in FIG. 1 is that in the direction from the substrate 10 to the open end 110a, a line connecting centers of the cross-sections of the first opening 110 is a broken line. In other words, in the direction from the substrate 10 to the open end 110a, the first opening 110 is in a bent shape.

In this embodiment, the first mask layer 11 may be a multi-layer structure, including a first thickness layer 115 close to the substrate 10 and a second thickness layer 116 away from the substrate 10, materials of the first thickness layer 115 and the second thickness layer 116 are different. The first thickness layer 115 and the second thickness layer 116 may be formed by for multiple times, and different materials facilitate formation of different sections of the first opening 110 for multiple times.

In other embodiments, the first opening 110 may rise in a twisted shape in the direction from the substrate 10 to the open end 110a. Correspondingly, the multi-layer structure of the first mask layer 11 may include more than three layers, and material of each layer is different, so as to form different sections of the first opening 110 for multiple times.

Figure 12:
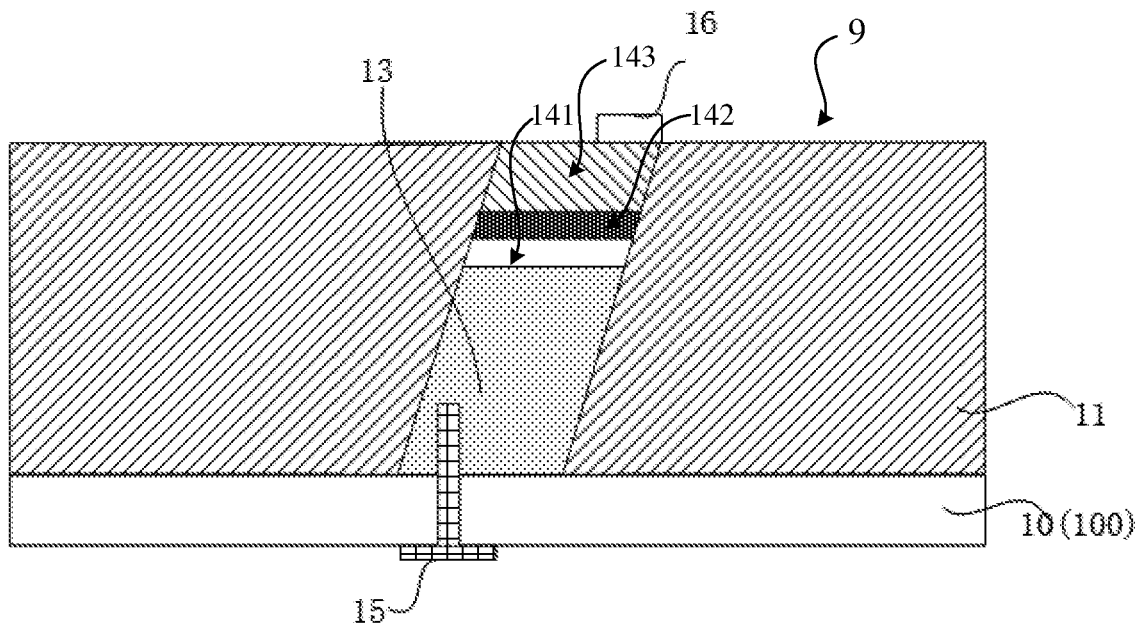
FIG. 12 is a cross-sectional schematic structural diagram of a light-emitting device according to an embodiment of the present disclosure.

FIG. 12 is a cross-sectional schematic structural diagram of a light-emitting device according to an embodiment of the present disclosure.

Referring to FIG. 12, a difference between the light-emitting device 9 of this embodiment and the light-emitting devices of the embodiments shown in FIG. 1 to FIG. 11 is that the light-emitting device 9 further includes:

a first electrode 15 penetrating through the substrate 10, the first electrode 15 being electrically connected to the second epitaxial layer 141; and a second electrode 16 penetrating through the first epitaxial layer 13, the active layer 142, the second epitaxial layer 141, the first mask layer 11, and the substrate 10, where the second electrode 16 being electrically connected to the third epitaxial layer 143.

Since the second epitaxial layer 141 is conductive, an insulating material layer 17 may be provided between the second electrode 16 and a sidewall of the through hole penetrating through the first epitaxial layer 13, the active layer 142, the second epitaxial layer 141, the first mask layer 11 and the substrate 10. An insulating material layer 17 may also be provided between the first electrode 15 and the second electrode 16.

The first electrode 15 and the second electrode 16 are not arranged on a light-emitting side of the light-emitting device, so that a light-emitting surface may be enlarged. In other embodiments, the first electrode 15 and the second electrode 16 may also be arranged on the light-emitting side, or the second electrode 16 may be arranged on the light-emitting side.

For the light-emitting device of this embodiment, if the conductivity types of the transition layer 101 and the first epitaxial layer 13 are the same as that of the second epitaxial layer 141, the first electrode 15 may only penetrate the semiconductor substrate 100.

The first electrode 15 and the second electrode 16 may be formed by filling up through holes with metal, where the through holes are formed by etching.

Figure 13:
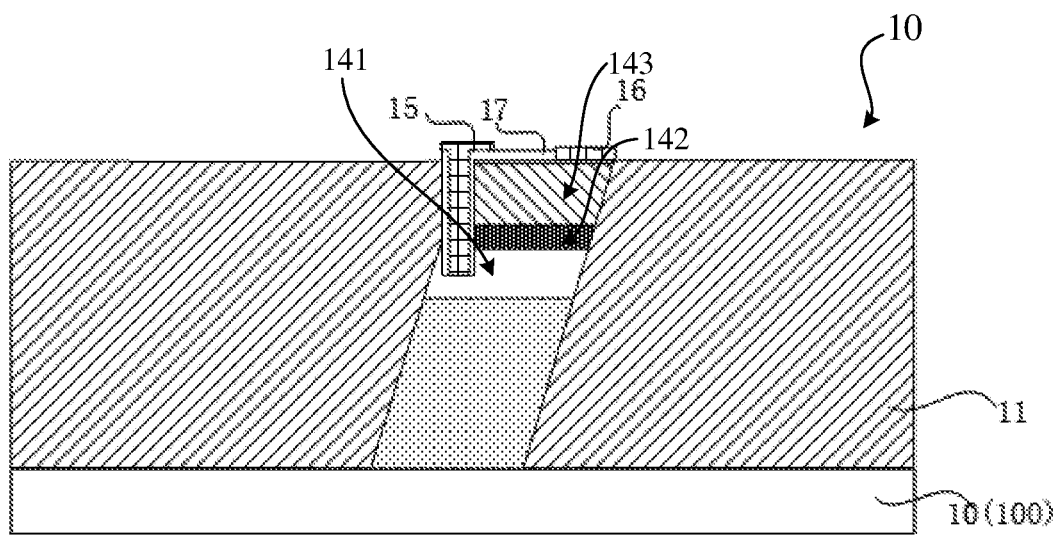
FIG. 13 is a cross-sectional schematic structural diagram of a light-emitting device according to an embodiment of the present disclosure.

FIG. 13 is a cross-sectional schematic structural diagram of a light-emitting device according to an embodiment of the present disclosure.

Referring to FIG. 13, a difference between the light-emitting device 10 of this embodiment and the light-emitting device of the embodiment shown in FIG. 1 to FIG. 11 is that between the light-emitting device 10 of this embodiment further includes:

a first electrode 15 penetrating through the active layer 142 and the second epitaxial layer 141, the first electrode 15 being electrically connected to the second epitaxial layer 141; and a second electrode 16 electrically connected to the third epitaxial layer 143.

An insulating material layer 17 may be provided between the first electrode 15 and a sidewall of the through hole penetrating through the active layer 142 and the second epitaxial layer 141. An insulating material layer 17 is also provided between the first electrode 15 and the second electrode 16.

The first electrode 15 and the second electrode 16 are provided on a light-emitting side of the light-emitting device 10.

The first electrode 15 may be formed by filling up a through hole with metal, where the through hole is formed by etching.

Figure 14:
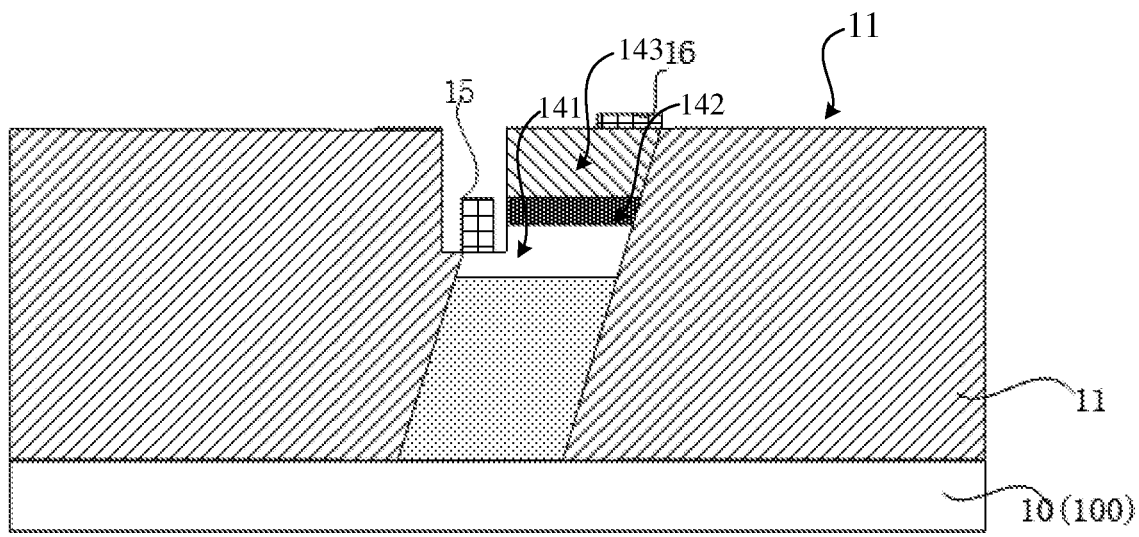
FIG. 14 is a cross-sectional schematic structural diagram of a light-emitting device according to an embodiment of the present disclosure.

FIG. 14 is a cross-sectional schematic structural diagram of a light-emitting device according to an embodiment of the present disclosure.

Referring to FIG. 14, a difference between the light-emitting device 11 of this embodiment and the light-emitting device of the embodiment shown in FIG. 1 to FIG. 11 is that the light-emitting device 11 of this embodiment further includes:

a first electrode 15, a groove penetrating through the active layer 142 and the second epitaxial layer 141, the groove exposing the second epitaxial layer 141, and the first electrode 15 being electrically connected to the second epitaxial layer 141; and a second electrode 16 electrically connected to the third epitaxial layer 143.

The first electrode 15 and the second electrode 16 are provided on a light-emitting side of the light-emitting device 11.

The first electrode 15 may be formed by filling up a through hole with metal, where the through hole is formed by etching.

Figure 15:
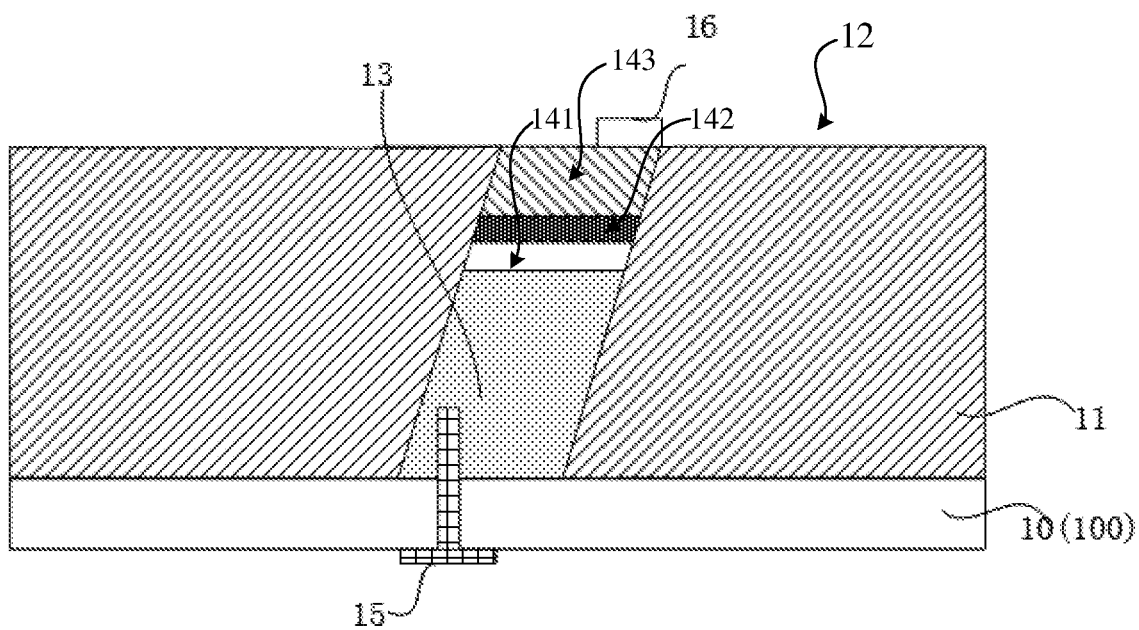
FIG. 15 is a cross-sectional schematic structural diagram of a light-emitting device according to an embodiment of the present disclosure.

FIG. 15 is a cross-sectional schematic structural diagram of a light-emitting device according to an embodiment of the present disclosure.

Referring to FIG. 15, a difference between a light-emitting device 12 of this embodiment and the light-emitting device of the embodiment shown in FIG. 1 to FIG. 11 is that the light-emitting device 12 of this embodiment further includes:

a first electrode 15 penetrating through a substrate 10, the first electrode 15 being electrically connected to the second epitaxial layer 141; and a second electrode 16 electrically connected to a third epitaxial layer 143;

the second electrode 16 being arranged on a light-emitting side of the light-emitting device 12.

The first electrode 15 may be formed by filling up a through hole with metal, where the through hole is formed by etching.

In the present disclosure, terms "first" and "second" are used for description only, and should not be understood as indicating or implying relative importance. The term "multiple" means one, two or more than two, unless otherwise clearly defined.

Although the present disclosure is disclosed as above, the present disclosure is not limited thereto. Any person skilled in the art may make various changes and modifications without departing from the spirit and scope of the present disclosure. Therefore, the protection scope of the present disclosure should be based on the scope defined in the claims.

What is claimed is:

1. A light-emitting device, comprising:
   a substrate;
   a first mask layer arranged on the substrate, wherein the first mask layer comprises a first opening exposing the substrate, the first opening comprises an open end, and an area of an orthographic projection of the open end on a plane where the substrate is located is smaller than an area of an orthographic projection of the first opening on the plane where the substrate is located; the first opening further comprises a bottom wall end arranged on a surface of the substrate, and the orthographic projection of the open end on the plane where the substrate is located and the bottom wall end are at least partially staggered;
   a first epitaxial layer epitaxially grown in the first opening on the substrate; and
   a light-emitting structure epitaxially grown in the first opening on the first epitaxial layer.

2. The light-emitting device according to claim 1, wherein the light-emitting structure comprises:
   a second epitaxial layer epitaxially grown in the first opening on the first epitaxial layer;
   an active layer arranged on the second epitaxial layer; and
   a third epitaxial layer arranged on the active layer.

3. The light-emitting device according to claim 2, further comprising:
   a first electrode penetrating through the substrate, wherein the first electrode is electrically connected to the second epitaxial layer; and
   a second electrode penetrating through the first epitaxial layer, the active layer, the second epitaxial layer, the first mask layer, and the substrate, wherein the second electrode is electrically connected to the third epitaxial layer.

4. The light-emitting device according to claim 3, further comprising:
   an insulating material layer provided between the second electrode and a sidewall of a through hole penetrating through the first epitaxial layer, the active layer, the second epitaxial layer, the first mask layer and the substrate; and
   an insulating material layer provided between the first electrode and the second electrode.

5. The light-emitting device according to claim 2, further comprising:
a first electrode penetrating through the active layer and the second epitaxial layer, wherein the first electrode is electrically connected to the second epitaxial layer; and
a second electrode electrically connected to the third epitaxial layer.

6. The light-emitting device according to claim 2, further comprising:
a first electrode;
a groove penetrating through the active layer and the second epitaxial layer, wherein the groove exposes the second epitaxial layer, and the first electrode is electrically connected to the second epitaxial layer; and
a second electrode electrically connected to the third epitaxial layer.

7. The light-emitting device according to claim 1, wherein the first mask layer is a multi-layer structure.

8. The light-emitting device according to claim 1, wherein the first mask layer comprises a plurality of first sub-layers and a plurality of second sub-layers alternately arranged, a refractive index of the plurality of first sub-layers is different with a refractive index of the plurality of second sub-layers to form a Bragg reflector, and the Bragg reflector makes a light emitted by the light-emitting structure exit in a direction, perpendicular to the plane where the substrate is located, away from the substrate.

9. The light-emitting device according to claim 1, wherein the first mask layer comprises a metal reflective layer, and an orthographic projection of the light-emitting structure on the plane where the substrate is located overlaps with at least a part of an orthographic projection of the metal reflective layer on the plane where the substrate is located, and the metal reflective layer makes the light emitted by the light-emitting structure exit in a direction, perpendicular to the plane where the substrate is located, away from the substrate.

10. The light-emitting device according to claim 1, wherein the first opening comprises a plurality of groups, each group comprises a plurality of first openings, and an area of an open end of each first opening in a group is different from each other in the group and/or a distance between open ends of each pair of adjacent first openings in the group is different from each other in the group, so that light-emitting wavelengths of light-emitting structures corresponding to different open ends are different.

11. The light-emitting device according to claim 10, wherein the light-emitting structure comprises an active layer arranged on the second epitaxial layer, a composition of the active layer is InGaN, and a content of In in InGaN of each first opening in the group is different from each other in the group.

12. The light-emitting device according to claim 1, wherein the orthographic projection of the open end on the plane where the substrate is located and the bottom wall end are completely staggered.

13. The light-emitting device according to claim 1, wherein the first opening is an oblique columnar opening.

14. The light-emitting device according to claim 13, wherein an inclination angle of the oblique columnar opening is less than or equal to 60°.

15. The light-emitting device according to claim 1, wherein in a direction from the substrate to the open end, a cross-sectional area of the first opening first increases and then decreases; or in the direction from the substrate to the open end, the cross-sectional area of the first opening gradually decreases; or in the direction from the substrate to the open end, the cross-sectional area of the first opening remains equal.

16. The light-emitting device according to claim 1, wherein in a direction from the substrate to the open end, a line connecting centers of cross-sections of the first opening is any one of a straight line, a broken line and a curved line.

17. The light-emitting device according to claim 1, wherein the substrate comprises a semiconductor substrate and a transition layer arranged on the semiconductor substrate, materials of the transition layer and the epitaxial layer are the same or different, and the transition layer is a common electrode of a plurality of light-emitting structures.

18. The light-emitting device according to claim 1, wherein a ratio of a thickness of the first epitaxial layer to a thickness of the light-emitting structure is greater than or equal to 2.

19. The light-emitting device according to claim 1, wherein a depth-width ratio of the first opening ranges from 3 to 10.

* * * * *